(12) United States Patent
Jung et al.

(10) Patent No.: US 6,581,820 B2
(45) Date of Patent: Jun. 24, 2003

(54) LEAD BONDING METHOD FOR SMD PACKAGE

(75) Inventors: Jong-Sung Jung, Kyungki-do (KR); Jong-Tae Kim, Kyungki-do (KR); Guem-Young Youn, Kyungki-do (KR); Chang-Dug Kim, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 09/916,772

(22) Filed: Jul. 27, 2001

(65) Prior Publication Data

US 2002/0179685 A1 Dec. 5, 2002

(30) Foreign Application Priority Data

Jun. 4, 2001 (KR) ............................ 2001-31169

(51) Int. Cl.⁷ .................. B23K 31/00; B23K 31/02; H05K 3/30; H01L 23/495
(52) U.S. Cl. .............. 228/175; 228/177; 228/179.1; 257/666; 257/675; 29/832
(58) Field of Search ............. 228/175–179.1, 228/180.1, 180.2, 123; 257/666, 670, 675; 29/830, 832, 840

(56) References Cited

U.S. PATENT DOCUMENTS

| | | | |
|---|---|---|---|
| 3,731,371 A | * 5/1973 | Piper et al. ............... 257/666 |
| 3,868,770 A | * 3/1975 | Davis et al. .............. 174/261 |
| 3,961,415 A | * 6/1976 | Davis, Jr. ................ 174/52.1 |
| 4,017,266 A | * 4/1977 | Goldberg et al. .......... 428/600 |
| 4,026,008 A | * 5/1977 | Drees et al. ............... 29/593 |
| 4,308,339 A | * 12/1981 | Lindberg .................. 216/14 |
| 4,542,438 A | * 9/1985 | Yamamoto ................ 361/771 |
| 4,570,150 A | * 2/1986 | Zandman et al. .......... 338/329 |
| 4,872,047 A | * 10/1989 | Fister et al. .............. 257/746 |
| 5,616,258 A | * 4/1997 | Dreizin et al. .......... 219/137 R |
| 5,634,267 A | * 6/1997 | Farnworth et al. .......... 29/832 |
| 6,040,621 A | * 3/2000 | Nose ...................... 257/666 |
| 6,119,927 A | * 9/2000 | Ramos et al. ............. 228/202 |
| 6,404,065 B1 | * 6/2002 | Choi ...................... 257/675 |
| 6,511,865 B1 | * 1/2003 | Lin ....................... 174/52.1 |

* cited by examiner

*Primary Examiner*—Tom Dunn
*Assistant Examiner*—L. Edmondson
(74) *Attorney, Agent, or Firm*—Renner, Otto, Boisselle & Sklar, LLP

(57) ABSTRACT

Disclosed herein is a lead bonding method for SMD packages. The lead bonding method includes the step of placing a package body with its lead-positioning surface facing upward. A lead with solder is arranged on the lead-positioning surface of the package body using vision system. The lead is spot-welded onto the package body to fix the lead to the package body. The package body spot-welded together with the lead is arranged in a positioning depression of a jig with the lead facing downward. The solder formed on the lead are melted to bond the lead to the package body.

8 Claims, 6 Drawing Sheets

LEAD BONDING METHOD FOR SMD PACKAGE

BACKGROUND OF THE INVENTION

1. Field of the Invention

The present invention relates generally to a lead bonding method for an SMD package, and more particularly to a novel lead bonding method that is capable of properly positioning a lead in the SMD package so as to completely prevent leakage.

2. Description of the Prior Art

As well known to those skilled in the art, a chip embedding package is generally used to mount a device having a specific function, such as a surface acoustic wave(SAW) filter, on a substrate in a rapid and simple manner. A chip embedded in the chip embedding package is electrically connected to a substrate via a lead provided in the package. The chip embedding package is generally classified into a pin-type package the lead of which is projected from it and soldered onto the substrate, or a surface mounted device (SMD) package that can be inserted into a recess formed on a substrate.

Such an SMD package is generally divided into an SMD package using Kovar or a flip type SMD package.

For the SMD package using Kovar, a lead that is electroless-plated with nickel is arranged on Kovar applied on a lead-positioning surface of a package body, and the nickel is seam-welded onto the package body. On the other hand, for the flip type SMD package, a lead and a package body are arranged respectively in a positioning depression or a depression to maintain proper position, and then welded together. A jig or holder has the positioning depression for the positioning of the package body and the lead, and serves as a heater in a final welding step. In general, the jig is made of graphite, and has a stepped structure in the positioning depression to properly position the package body and the lead.

In a lead bonding process of such a flip type SMD package, it is important to properly position the lead and the package body in advance to prevent leakage after the final welding. In order to properly position the lead and the package body, the holder is provided with a number of depression-shaped positioning depressions each having the same shape and size as those of the lead and the package body. In general, the holder utilizes the jig made of graphite.

Hereinafter, detailed description will be given about a conventional SMD package bonding method using a graphite jig 10 with reference to FIGS. 1a to 1d.

FIGS. 1a to 1d show the steps of the conventional SMD package bonding method. As shown in FIG. 1a, a lead 20 is arranged in a lead-positioning depression surrounded by the stepped portion 10a of a positioning depression 12. The lead 20 includes solder portions 20a of Au—Sn to be bonded to a package body 25. The stepped portion 10a is provided in the bottom of the positioning depression 12 to receive the package body 25 and the lead 20 having lengths different from each other (the lead is 2.35 mm and the package body is 2.5 mm, in general), and defines positioning depressions to fit the lengths, respectively. In other words, the positioning depression 12 provides the lead-positioning depression surrounded by the stepped portion 10a and a package body-positioning depression defined by the sidewall of the positioning depression 12 above the stepped portion 10a. In this way, if the lead 20 and the package body 25 are simply arranged to be fit for the shape of the depressions, the lead 20 and the package body 25 can be automatically positioned properly. Using such a scheme, the lead 20 is arranged in the lead-positioning depression of the positioning depression 12 to be positioned as shown in FIG. 1b, and then the package body 25 is arranged above the lead 20 in the lead-positioning depression to be positioned in the package body-positioning depression defined by the side wall of the positioning depression 12 as shown in FIG. 1c. Then, as shown in FIG. 1c, a current is supplied through electrodes formed at both ends of the graphite jig 10 to heat the graphite jig 10 while the package body 25 is closely pressed against the lead 10 using a pressing means 30 so that the lead 20 and the package body 25 can be bonded together. Here, the graphite jig 10 serves as a heater to melt solder of the lead 20. Through such process, the lead 20 and the package body 25 can be properly positioned to form the SMD package.

However, the deviation of the lead due to malpositioning and resultant leakage generation cannot be completely prevented even in the SMD package bonding method because the positioning of the package body and the lead is dependent upon only proper settlement of the package body and the lead in the positioning depression. Additionally, such improper settlement cannot be detected easily due to the small sizes of the package body and the lead.

FIGS. 2a and 2b show examples of malpositioning.

As depicted in FIG. 2a, when the lead 20 fails to be properly positioned inside of the stepped portion with one side laid on the stepped portion, the package arranged on the lead will not be properly positioned. Therefore, leakage takes place when the package body is arranged on the lead and bonded.

As another example, malpositioning can take place when the package body has a side that is poorly cut in a cutting process.

Referring to FIG. 2b, even if the lead is properly positioned in the lead-positioning depression, the package body with the defective side "A" cannot fit into the positioning depression for proper positioning. Therefore, leakage takes place also when the lead is bonded in this state.

To prevent such malpositioning, the position should be inspected separately after each step. However, this has a problem of making the fabrication process of the package complicated.

Moreover, the graphite jig is made of a graphite material that has weak mechanical strength and can be easily damaged or broken. In particular, a damaged portion "B" in the stepped portion as shown in FIG. 2c will cause inevitable malpositioning. In other words, since the lead-positioning depression and the package body-positioning depression cannot be formed suitably, desirable positioning cannot be expected for the lead or the package body.

As described above, according to an SMD package bonding method of the prior art, such malpositioning frequently takes place in various forms so that solution is difficult to find. Also, when the stepped structure is damaged, the graphite jig should be replaced with a new one, accordingly increasing production cost.

SUMMARY OF THE INVENTION

Accordingly, the present invention has been made keeping in mind the above problems occurring in the prior art, and an object of the present invention is to provide a lead bonding method, by which a lead and a package body are positioned by a vision system and then fixed through spot welding without using a graphite jig having a stepped structure which can be easily damaged, so that leakage due to malpositioning can be completely prevented.

In order to accomplish the above object, the present invention provides a lead bonding method, comprising the steps of: placing a package body with its lead-positioning surface facing upward; arranging a lead with solder on the lead-positioning surface of the package body; spot-welding the lead onto the package body to fix the lead to the package body; providing the package body spot-welded together with the lead in a positioning depression of a jig with the lead facing downward; and bonding the lead to the package body by melting the solder formed on the lead.

The step of arranging the lead on the package body may include the steps of: photographing the package body; analyzing image data obtained in the photographing step to find position information of the package body; and arranging the lead on the lead-positioning surface of the package body on the basis of the position information found in the analyzing step.

The step of spot-welding may consist of selecting at least one of sides of the lead and spot-welding the lead onto the package body.

The step of spot-welding may consist of selecting central portions of both sides of the lead and spot-welding the lead to the package body.

The step of bonding the lead onto the package body may include the steps of: connecting electrodes at both ends of the graphite jig; and applying voltage to the graphite jig through the connected electrodes to melt solder of the lead.

The step of bonding the lead onto the package body may consist of heating the jig containing the package body and the lead in a calcinating furnace to melt solder of the lead.

The jig used in such bonding process has no stepped structure in the positioning depression unlike the graphite jig of the prior art, and thus has a stable structure with low risk of breakage. Also, advantageously the jig can be manufactured easily.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter detailed description will be given about a lead bonding method for SMD packages in accordance with the present invention.

Figure 1A:
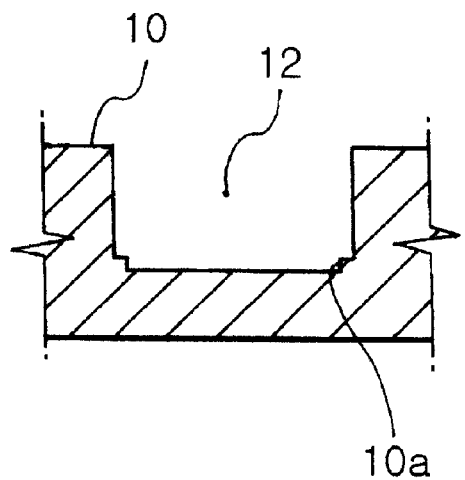
FIGS. 1a to 1d are sectional views showing the steps of a conventional lead bonding method.
Figure 1B:
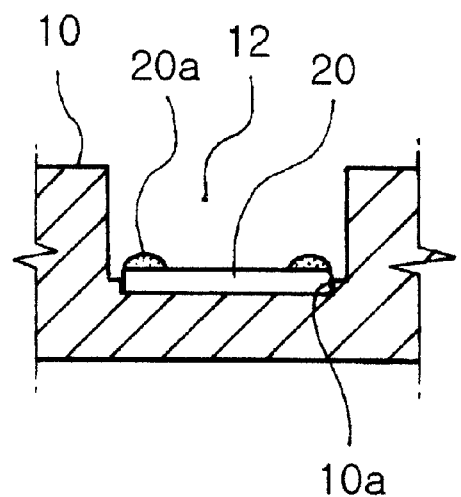
Figure 1C:
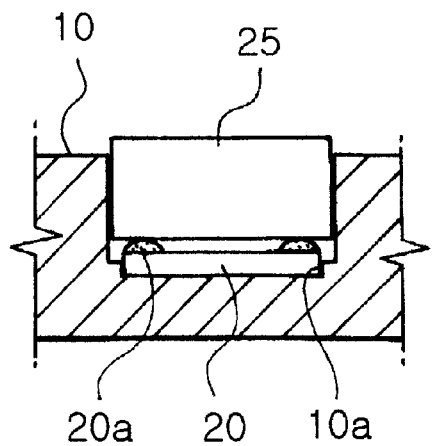
Figure 1D:
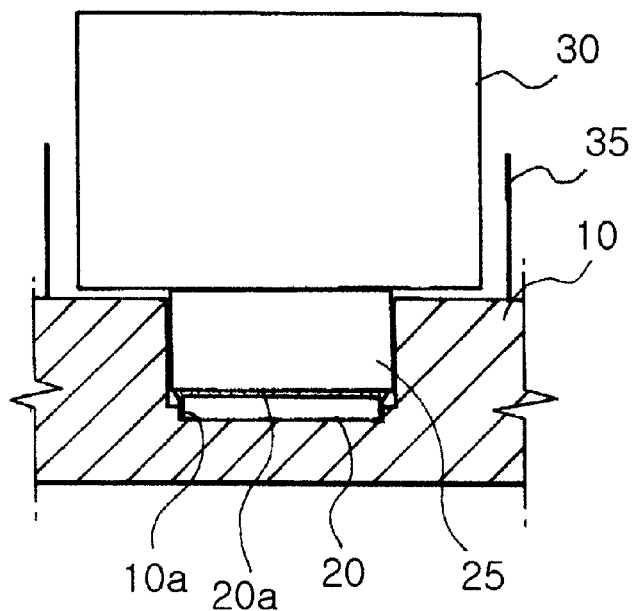
Figure 2A:
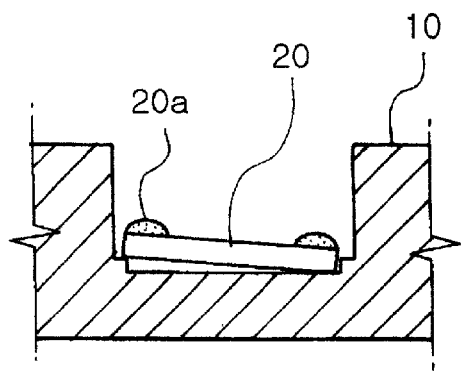
FIGS. 2a to 2c are sectional views showing examples of malpositioning that may be caused by the conventional lead bonding method.
Figure 2B:
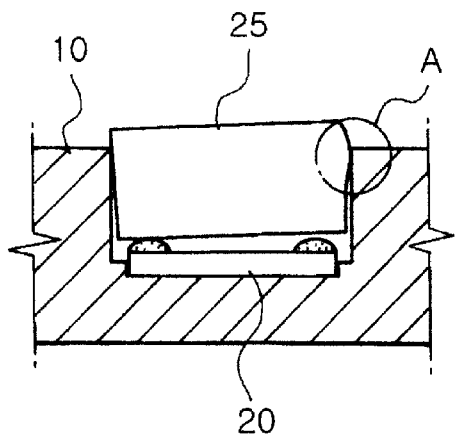
Figure 2C:
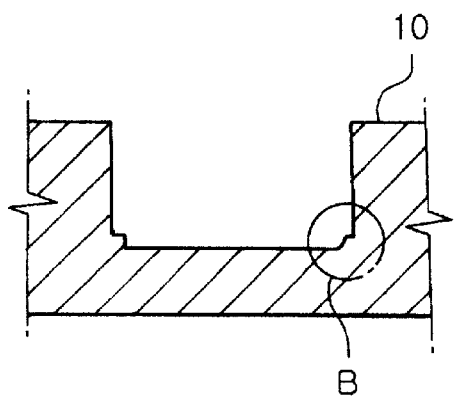
Figure 3A:
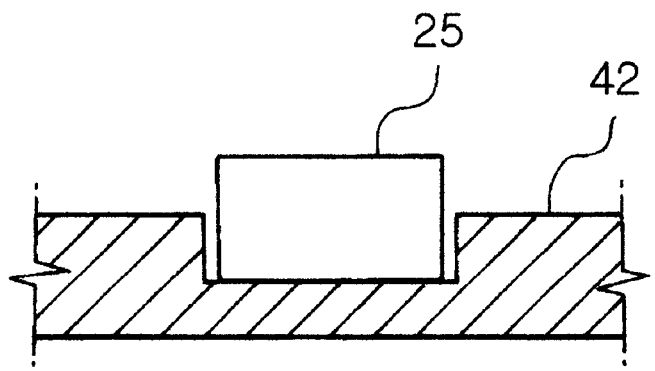
FIGS. 3a to 3d are sectional views showing the steps of a lead bonding process in accordance with the present invention.

FIGS. 3a to 3d schematically show the steps of the lead bonding method for SMD packages. First, as shown in FIG. 3a, a package body 25 is arranged in a positioning depression of a holder 42 so as to allow a lead positioning surface of the package body 25, on which a lead will be positioned, to face upward. The holder 42 is made of a common non-magnetic material or graphite material, and has a plurality of positioning depressions. Each of the positioning depressions of the holder 42 is not required to have the same size as that of the package body or have the same stepped structure as that of the positioning depression of the conventional graphite jig. Therefore, the jig of the present invention can be easily manufactured, and malpositioning due to breakage of the stepped structure can be prevented.

Figure 3B:
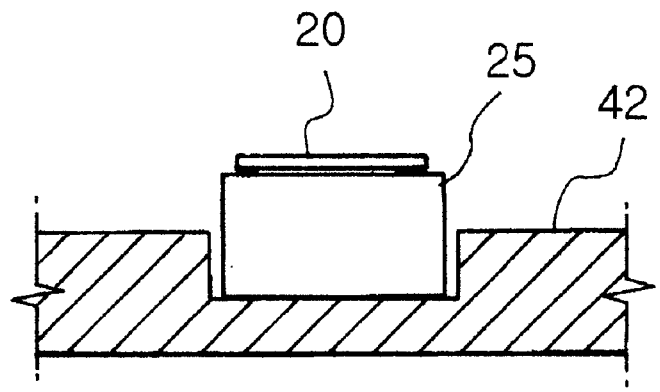

As shown in FIG. 3b, the lead 20 is positioned in the lead positioning surface of the package body 25 using a vision system (not shown). That is, an image pickup device, such as a charge coupled device(CCD), is used to photograph each package body positioned in the holder and find the position of the package body using photographed image data. Then, the position of the lead or package body is adjusted so that the lead can be properly positioned on the lead positioning surface of the package body 25. This lead positioning method using the vision system will be described in more detail later.

Figure 3C:
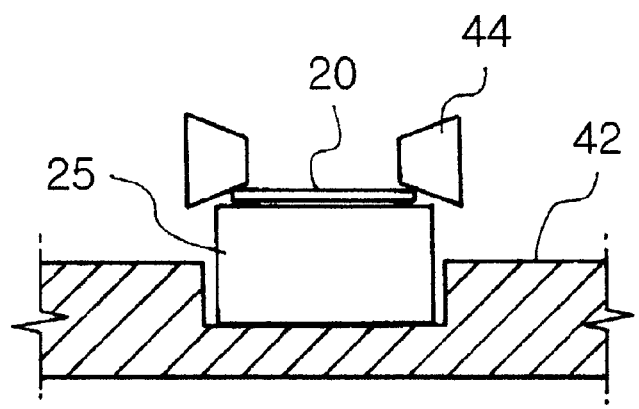
Figure 3D:
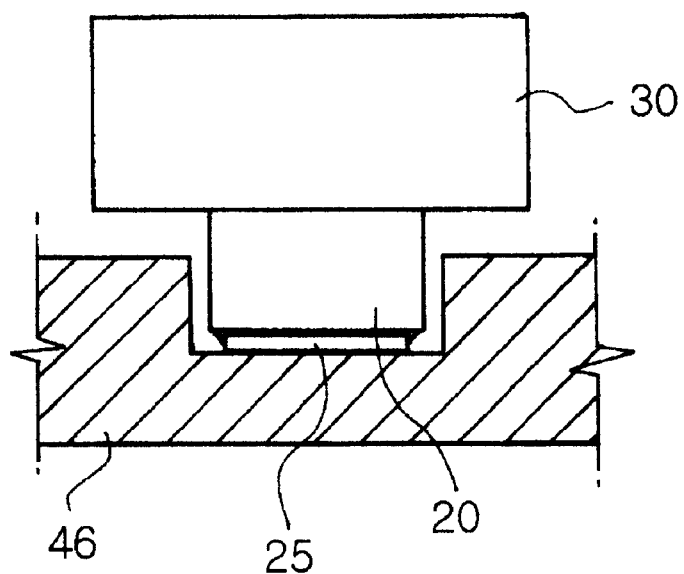

While the lead 20 is positioned on the package body 25, the lead 20 is spot-welded onto the package body 25 so as to fix the lead 20 to the package body 25 and maintain the proper position of the lead 20 and the package 25 as shown in FIG. 3c. In other words, both sides of the lead can be welded by spot welding electrodes(or sealing head) 44 to fix the proper position of the lead on the package body. Spot-welding is preferably performed at opposite central portions of the both sides of the lead so that the electrodes in contact with the lead will not move the lead from the proper position. The spot welding is not limited to this welding method.

Then, as shown in FIG. 3c, the package body 25 spot-welded together with the lead 20 is arranged in the positioning depression of a graphite jig 46, and then can be bonded together in the same manner as that of an electric welding process using the conventional graphite jig. Here, the graphite jig 46 adopted in the present invention does not need the foregoing stepped structure of the prior art because the lead 20 and the package body 25 are previously fixed together by the spot welding process. Therefore, malpositioning due to mechanical breakage such as damage on the stepped portion can be fundamentally prevented, and the jig can be easily manufactured and life span thereof can be prolonged, thereby enhancing productivity. Such a final melting step can be realized when a voltage is applied to both ends of the jig 46 and the package body 25 is pressed under a certain degree of pressure using a pressing means 30.

Unlike the bonding method of the prior art, according to the SMD package bonding method of the present invention, the lead and the package are positioned using the vision system instead of being fit into the depressions of the graphite jig, fixed together by a spot welding process, and finally bonded together using the graphite jig so that an SMD package can be fabricated without malpositioning.

Hereinafter detailed description will be given about a process for properly positioning the lead on the package body using the vision system and a process of performing spot welding for fixing the positioned state in the bonding method of the present invention with reference to FIG. 4.

Figure 4:
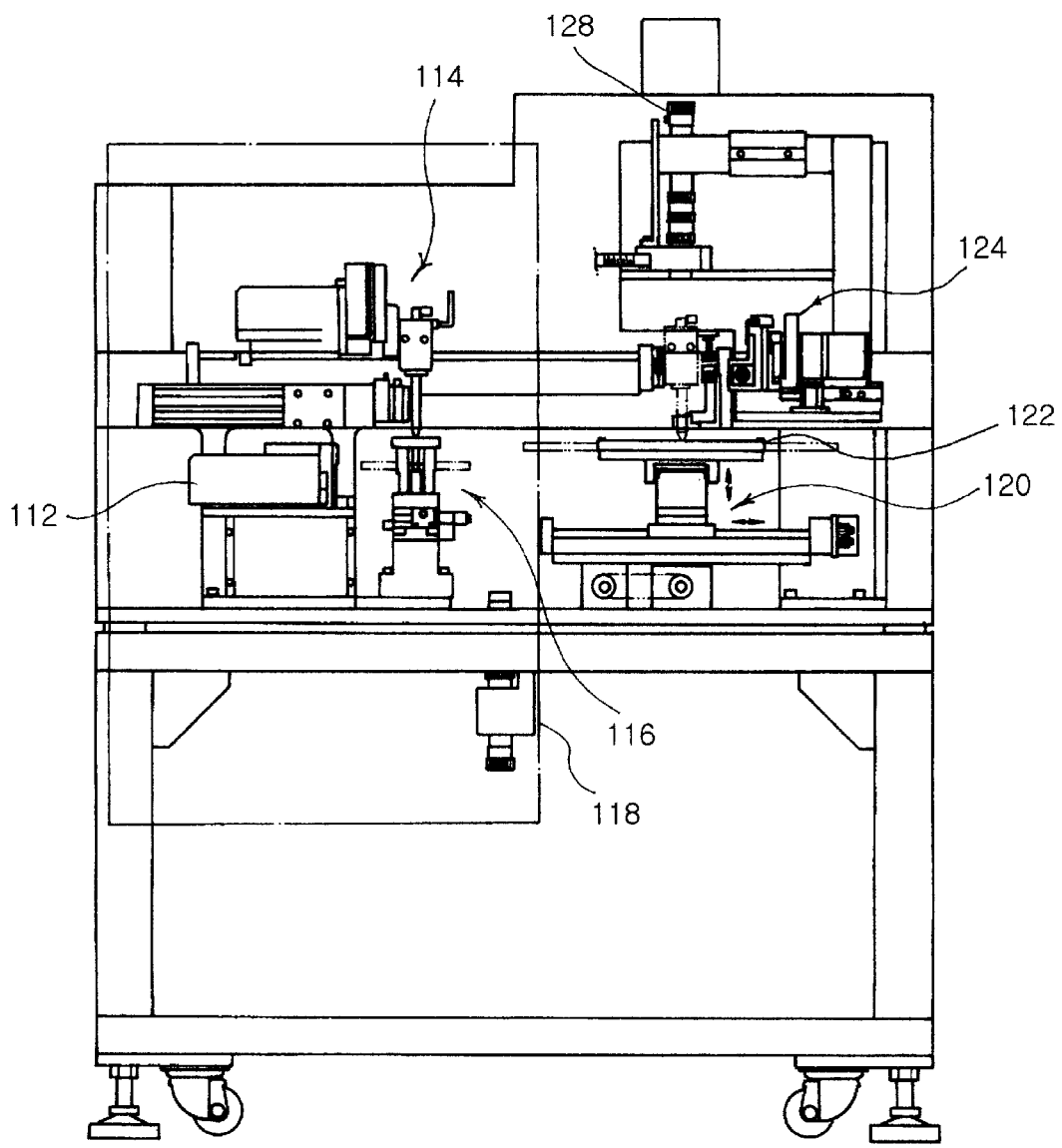
FIG. 4 is a schematic diagram of a lead positioning apparatus employed in the lead bonding method of the present invention.

FIG. 4 schematically shows a lead positioning apparatus 100. The lead positioning apparatus 100 properly positions the lead on the package body and fixes the lead to the package body by a spot welding process. The lead positioning apparatus 100 is comprised of a pickup unit 114 for transporting the lead, a package body positioning unit 120 for adjusting the position of the package body and a sealing head 124 for performing spot welding. Also, the apparatus 100 has a lead camera 118 and a package body camera 128 to inspect the positions of the lead and the package body. First, the pickup unit 114 selects one lead from a lead cassette which stores a number of leads, and a lead position compensating unit 116 adjusts the lead on the package body to a proper position, the lead is transported to a certain position on a package body positioning unit 120. Meanwhile, the holder (not shown) on which the plurality of package bodies are arranged is laid on a transporting mount 122 and arranged on the package body positioning unit 120. As described above, the holder has the plurality of positioning depressions, and the package body is arranged in each of the positioning depressions with the lead-positioning surfaces facing upward. The package body camera 128 is used to obtain a photographed image of the package body, from which information about the position of the package body is obtained. The package body positioning unit 120 suitably transports the package body along a horizontal surface according to information on the position of the package body, and thus adjusts the package body to be positioned on the same vertical line as that of the lead transported by the pickup unit 114 for proper positioning. After the package body positioning unit 120 completes the adjustment of the package body, the pickup unit 114 positions the lead on the lead-positioning surface of the package body. When a positioning step is completed, the sealing head 124 spot-welds the central portions of the both sides of the lead on the package body to maintain a proper position. Also, information on the position of the package body photographed by the package body camera 128 is compared with information photographed by the lead camera 118 so that the lead transported by the pickup unit 114 can be adjusted to available suitable arrangement to enhance efficiency. Since each package body is arranged in the positioning depression in a similar manner, working time for positioning the package body can be reduced in such a way that the position of the lead is adjusted according to the position of the package body, thereby enhancing working efficiency.

As described hereinbefore, according to the lead bonding method for SMD package of the present invention, the package body and the lead are positioned using the vision system instead of using the step-structured positioning depressions, fixed together by a spot welding process, and, thereafter bonded together, thereby preventing malpositioning. The graphite jig used in the bonding process of the present invention can be easily manufactured without a stepped structure in each of the positioning depressions thereof. Further, the package is previously fixed by a spot-welding process so that leakage due to defect of the graphite jig can be completely prevented.

Although the preferred embodiments of the present invention have been disclosed for illustrative purposes, those skilled in the art will appreciate that various modifications, additions and substitutions are possible, without departing from the scope and spirit of the present invention as disclosed in the accompanying claims.

What is claimed is:

1. A lead bonding method, comprising the steps of:

placing a package body with its lead-positioning surface facing upward;

arranging a lead with solder on the lead-positioning surface of the package body;

spot-welding the lead onto the package body to fix the lead to the package body thereby to maintain the proper position of the lead and the package body;

providing the package body spot-welded together with the lead in a positioning depression of a jig with the lead facing downward; and bonding the lead to the package body by melting the solder formed on the lead thereby to connect the lead and package body electrically.

2. The lead bonding method according to claim 1, wherein said step of arranging the lead on the package body includes the steps of:

photographing the package body;

analyzing image data obtained in said photographing step to find position information of the package body; and arranging the lead on the lead-positioning surface of the package body on the basis of the position information found in said analyzing step.

3. The lead bonding method according to claim 1, wherein said step of spot-welding consists of selecting at least one of sides of the lead and spot-welding the lead onto the package body.

4. The lead bonding method according to claim 1, wherein said step of spot-welding consists of selecting central portions of both sides of the lead and spot-welding the lead to the package body.

5. The lead bonding method according to claim 1, wherein said jig is made of graphite.

6. The lead bonding method according to claim 5, wherein said step of bonding the lead onto the package body includes the steps of:

connecting electrodes at both ends of the graphite jig; and applying voltage to the graphite jig through the connected electrodes to melt solder of the lead.

7. The lead bonding method according to claim 1, wherein said step of bonding the lead onto the package body consists of heating the jig containing the package body and the lead in a calcinating furnace to melt solder of the lead.

8. The lead bonding method according to claim 1, wherein solder of the lead is made of at least one alloy selected from a group including Au—Sn, Pb—Sn and Sb—Sn.

* * * * *